United States Patent [19]

Enoch et al.

[11] 3,971,037
[45] July 20, 1976

[54] MAGNETIC BUBBLE SHIFT REGISTER

[75] Inventors: Reginald David Enoch, Pinner; Mervyn Evan Jones, London, both of England

[73] Assignee: The Post Office, London, England

[22] Filed: May 14, 1975

[21] Appl. No.: 577,460

Related U.S. Application Data

[63] Continuation of Ser. No. 385,725, Aug. 6, 1973, abandoned.

[30] Foreign Application Priority Data

Aug. 8, 1972 United Kingdom............... 36895/72

[52] U.S. Cl........................................... 340/174 TF
[51] Int. Cl.²......................................... G11C 11/14
[58] Field of Search ............................. 340/174 TF

[56] References Cited
OTHER PUBLICATIONS
IBM Technical Disclosure Bulletin—vol. 15, No. 6, Nov. 1972, p. 1798.

*Primary Examiner*—James W. Moffitt
*Attorney, Agent, or Firm*—Hall & Houghton

[57] ABSTRACT

A digital data storage element using magnetic bubbles, or small cylindrical magnetic domains formed in a thin film of magnetic material, in which binary information is stored by providing two alternative positions for a magnetic bubble, a pattern of high permeability magnetic material being provided adjacent to the surface of the film to constrain the bubble to lie in any one of the two positions. Information can be transferred from one storage element to another by the mutual repulsion effect of the magnetic bubbles. Shifting registers using two storage elements per bit are described using the mutual repulsion effect of the bubbles to effect data transfer along the register. The use of a small field pulsed with microsecond pulses superimposed on a steady field is described for encouraging the generation of bubbles.

12 Claims, 6 Drawing Figures

MAGNETIC BUBBLE SHIFT REGISTER

This is a continuation of application Ser. No. 385,725, filed Aug. 6, 1973, and now abandoned.

This invention relates to data storage and in particular to the storage of digitally coded data in the form of "magnetic bubbles".

It has been proposed to store digital data in a magnetizable material in the form of small cylindrical magnetic domains of opposite magnetisation to the main body of magnetic material. In the journal "Scientific American", for June 1971, there was published an article entitled "Magnetic Bubbles" by A. H. Bobeck and H. E. D. Scovil, in which the generation of small cylindrical domains of opposite magnetization to a main body of magnetic material was described, the magnetic material being the form of a single crystal wafer, for example, a magnetic garnet formed as an epitaxial layer on a non-magnetic substrate of a single crystal material compatible with the garnet. In the absence of an external magnetic field the wafer of garnet contains equal areas of magnetic domains of opposite magnetisation. A magnetic field through the thickness of the wafer has the effect of reversing some of the domains that are magnetised in the opposite direction, and if the magnetic field is strong enough the whole of the material will be magnetised in the same direction as the magnetic field. However, at a field strength just below that giving rise to the magnetization of the entire wafer in one direction the domains that were magnetised in the opposite direction tend to remain as small cylindrical domains separate from one another, and these cylindrical domains, which are termed "magnetic bubbles", can be caused to move about in the wafer under the influence of magnetic fields at high speeds, relative to the size of the domains. The actual size of the cylindrical domains depends on the material used, but they have a typical diameter of only 5 to 10 microns.

Hitherto, work on the employment of these domains for digital data storage has concentrated on the production of very long shifting registers formed by patterns of high permeability magnetic material formed on the wafer, so that a group of bubbles and associated spaces, corresponding respectively to the ones and zeros of a binary coded number, can be caused to progress through the register.

A number of problems has arisen in respect of the use of magnetic bubbles in data storage in this way. For example, the material of the magnetic film (garnet) must be virtually free of any defects along the entire length of the propagation path of the bubbles, as such defects tend to trap bubbles and lead to loss of information. The controlled generation of the bubbles themselves has been unreliable, in particular with operation at very high bit rates; such generation is necessary when using the bubbles in the manner described above. The propagation of the bubbles along the shifting register can be effected at high speeds but problems have been met taking the bubbles around corners, which are, of course, essential for folding the register back on itself to achieve compact storage of data.

It is an object of the present invention to utilise magnetic bubbles for data storage in novel manner in which the above difficulties are substantially reduced, the positions of bubbles in respective storage elements indicating the states of those elements. A succession of such elements can be used to form a shifting register.

According to the present invention there is provided a binary digital storage element including a film of magnetic material, means for providing a magnetic field across which the film is disposed so as to sustain cylindrical magnetic domains in the film, an elongate pattern of high permeability magnetic material adjacent the surface of the film, the pattern retaining a first cylindrical magnetic domain at one end or the other thereof, means for bringing a second magnetic domain adjacent the one end of the pattern, means for selectively bringing a third magnetic domain adjacent the one end of the pattern in dependence upon the digit to be stored, the second and third domains when adjacent the one end of the pattern being such as to displace the first domain from the one end to the other end of the pattern by magnetic repulsion, and means responsive to the presence of the first domain adjacent the other end of the pattern to derive an indication of the digit stored and for shifting the first domain from the other end to the one end of the pattern.

The means for bringing second and third magnetic domains adjacent to one end of the pattern may include second and third elongate patterns of high permeability magnetic material adjacent the surface of the film, the second and third patterns each being such as to tend to retain a cylindrical magnetic domain adjacent one end or the other thereof, one end of each of the second and third elongate patterns being adjacent the one end of the first-mentioned pattern, means associated with the second elongate pattern and responsive to the data to be stored to cause a cylindrical magnetic domain to appear adjacent the one end of the second pattern or not in dependence upon the data, and clock pulse means associated with the third pattern to cause a cylindrical magnetic domain to appear adjacent the one end of the third pattern. The arrangement of the three patterns is such that a cylindrical magnetic domain adjacent the one end of the first-mentioned pattern is moved to the other end of the pattern if cylindrical magnetic domains appear adjacent the one ends of both of the second and third patterns, but not if a cylindrical magnetic domain does not appear adjacent either one or both of the one ends of the second and third patterns.

The means responsive to the presence of the first domain to derive an indication of the digit stored may include two further elongate patterns of high permeability magnetic material similar to the second and third patterns, the further patterns being similarly disposed relative to the other end of the first-mentioned pattern as the second and third patterns are disposed relative to the one end of the first mentioned pattern. One of the further patterns is responsive to a clock pulse similarly to the third pattern to enable a cylindrical magnetic domain associated with the other further pattern to respond to the data stored.

A shifting register having a two-phase clock can be constructed using patterns of high permeability magnetic material in the manner described above. Three patterns together, as described for data entry into and read out from the storage element, operate as a two input AND gate, and therefore at least certain logical circuits can be produced using the storage element of the invention.

The patterns themselves may take the form of elongate rectangular strips which may be straight or slightly curved, or each may consist of a pair of C-shaped members with their openings facing each other. Another alternative pattern consists of a rectangular array of six small spots defining adjacent approximately square areas. Other patterns may be used and may have advantages in particular circumstances.

The invention differs from prior art proposals in that data is propagated like a wave by transferring the positions of magnetic domains from one storage element to the next along a register, whereas in the prior art a string of magnetic domains and vacancies for domains progresses along the register. In the present invention the domains themselves are not propagated along the register.

In order that the invention may be fully understood and readily carried into effect it will now be described with reference to the accompanying drawings of which:

Figure 1:
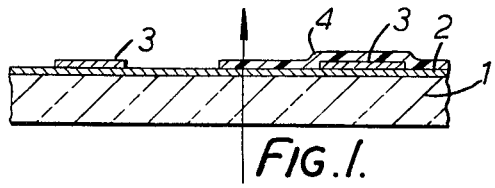
FIG. 1 is a cross-section (not to scale) of part of a structure according to an example of the invention.

Referring to FIG. 1, the device includes a substrate 1 formed of non-magnetic single crystal material of structure compatible with a magnetic garnet, the choice of the material itself is not important providing that it has the desired properties. On the surface of the substrate 1 is deposited epitaxially a thin film 2 of magnetic garnet having a thickness of about 10 microns. One example of a suitable garnet has the formula $Eu_1Er_2Ga_{0.7}Fe_4O_{12}$. On the upper surface of the film 2 is deposited a pattern of a high permeability magnetic material 3, such as, for example, permalloy. Associated with part of the permalloy pattern is a conductor 4 formed of any suitable nonmagnetic electrical conductor such as, for example, copper.

In the operation of the device of FIG. 1 a magnetic field indicated by the arrow through the thickness of the film 2 is generated, the field having such a strength as to tend to form the cylindrical magnetic domains known as "bubbles" in the garnet of the film 2. It has been found that by superimposing on a steady magnetic field a smaller field pulsed with microsecond pulses at a repetition rate, for example, 1KHz, larger magnetic domains break up into bubbles and the whole of the film 2 can be occupied by bubble domains.

Figure 2:
FIGS. 2 and 3 represent two examples of alternative configurations for the high permeability magnetic material for use as a data storage element in accordance with the invention.

The patterns of high permeability magnetic material are such that a magnetic bubble can be moved from one end to the other of a pattern. The existence of a magnetic bubble at one end of a pattern is chosen to represent binary 0 and at the other end binary 1. FIG. 2 shows one example of a pattern found to be suitable, consisting of two C shaped members A and B with their openings facing one another. As shown in FIG. 2, a magnetic bubble C is located within the member B, and the application of a suitable magnetic field will cause the bubble to move to D, within the member A. With this pattern of magnetic material it has been found that a magnetic bubble will remain stably within either of the members A and B and that a magnetic field of a certain minimum strength is necessary to cause the bubble to shift to within the other member. The bubble will not tend to move out of the storage element unless a very much greater magnetic field is applied, sufficient to enable it to pass the high permeability magnetic material.

Figure 3:
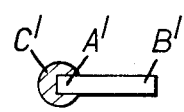

FIG. 3 shows an alternative storage element consisting of a simple rectangular bar of high permeability magnetic material. A magnetic bubble C' tends to remain at one end A' or the other B' of the bar but the bubble can be moved from one end to the other by means of an applied magnetic field. As with FIG. 2, there is a reasonable tolerance in the strength of the magnetic field necessary to move the bubble from one end of the bar to the other without causing it to leave the bar altogether.

Figure 4:
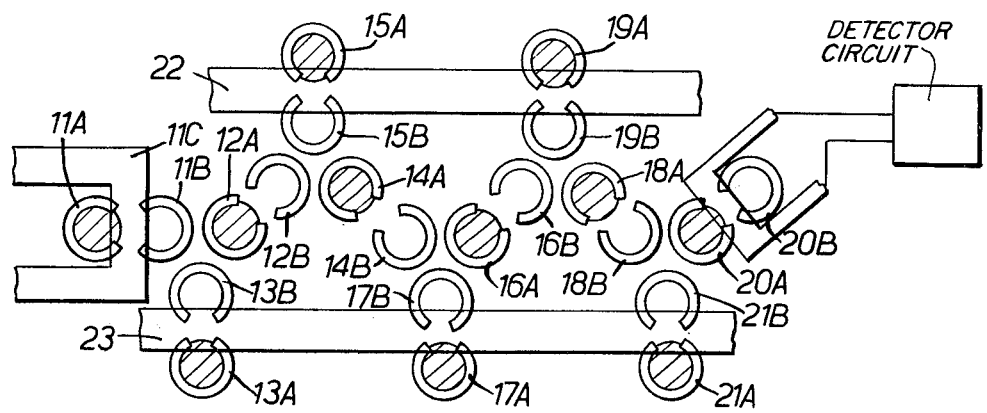
FIG. 4 shows a shifting register constructed in accordance with an example of the present invention using a storage element of the type shown in FIG. 2.

FIG. 4 shows a shifting register constructed from storage elements of the type shown in FIG. 2. This shifting register has a data input element 11A,11B; register stage elements 12A,12B; 14A,14B; 16A,16B; 18A,18B; and 20A,20B; a first set of shifting elements 13A,13B; 17A,17B; and 21A,21B; and a second set of shifting elements 15A,15B; and 19A,19B; A conductor 11C is formed over the middle of storage element 11A,11B; to shift a magnetic bubble from member 11A to member 11B when a 1 is to be entered into the register, and leaving the bubble in member 11A when an 0 is to be entered. Conductors 22 and 23 pass over the middles of the second and first shifting elements respectively, two-phase shift pulses being applied in the usual way to the conductors 22 and 23 to shift data along the register. An important point to observe about FIG. 4 is the proximity of members 11B, 12A and 13B to one another and the similar relative proximity of other groups of three members of storage elements.

As shown in FIG. 4, the magnetic bubbles are all in the members of the storage elements corresponding to the 0 state. If a 1 is to be entered into the register an electrical pulse on the conductor 11C causes the bubble in storage element 11A, 11B to move to within the member 11B. A first phase shift pulse along the conductor 23 moves the magnetic bubbles from members 13A, 17A and 21A to 13B, 17B and 21B respectively. As a result of this all three of the members 11B, 12A and 13B contain magnetic bubbles. It is a property of magnetic bubbles that they tend to repel one another and the shapes of the members 11B, 12A and 13B and their spacing are arranged so that a magnetic bubble can be present in any two of the three members and remain there without being displaced to the respective other members of the storage elements, but that when a third bubble is present the repulsion forces between the bubbles are sufficient to cause the bubbles which can move away from the other bubbles. Thus the bubble in member 12A is moved into member 12B and the bubble in member 11B is moved back in the member 11A. The magnetic bubble in the member 13B is held there by the shift pulse in conductor 23. The shift pulses of both first and second phases each include a second part of opposite polarity so that the bubble in 13B is returned to the member 13A. The bubbles in elements 17A, 17B and 21A, 21B are also moved and returned by the shift pulse but they have no effect on the bubbles in the storage elements associated with them because in no case are there bubbles in adjacent members of storage elements.

In order to follow the operation of the shifting register shown in FIG. 4, in greater detail, the following table sets out the member of each storage element in which the bubble of that element is located at each stage in the operation of the register when receiving the digits 110 from the conductor 11C:

|  | 11 | 12 | 13 | 14 | 15 | 16 | 17 | 18 | 19 | 20 | 21 |
|---|---|---|---|---|---|---|---|---|---|---|---|
| Initial State | A | A | A | A | A | A | A | A | A | A | A |
| First Digit"1" | B | A | A | A | A | A | A | A | A | A | A |
| First Phase Shift Pulse | B<br>↓<br>A | A<br>↓<br>B | B | A | A | A | B | A | A | A | B |
| Second Phase Shift Pulse | A | B<br>↓<br>A | A | A<br>↓<br>B | B | A | A | A | B | A | A |
| Second Digit"1" | B | A | A | B | A | A | A | A | A | A | A |
| First Phase Shift Pulse | B<br>↓<br>A | A<br>↓<br>B | B | B<br>↓<br>A | A | A<br>↓<br>B | B | A | A | A | B |
| Second Phase Shift Pulse | A | B<br>↓<br>A | A | A<br>↓<br>B | B | B | A | A<br>↓<br>B | B | A | A |
| Third Digit"0" | A | A | A | B | A | A | A | B | A | A | A |
| First Phase Shift Pulse | A | A | B | B<br>↓<br>A | A | A<br>↓<br>B | B | B<br>↓<br>A | A | A<br>↓<br>B | B |

Figure 5:
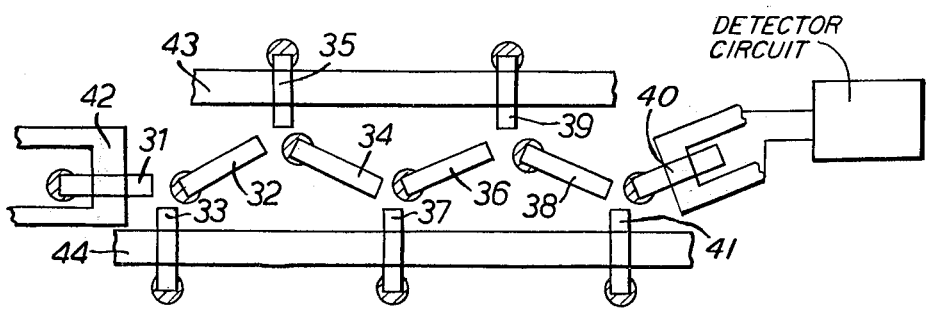
FIG. 5 shows the shifting register of FIG. 4 using the storage elements of the type shown in FIG. 3.

FIG. 5 shows a shifting register of FIG. 4 constructed from the storage elements shown in FIG. 3 instead of those shown in FIG. 2. The operation of this register is exactly the same as that of FIG. 4 described above, and will therefore not be described in detail.

Figure 6:
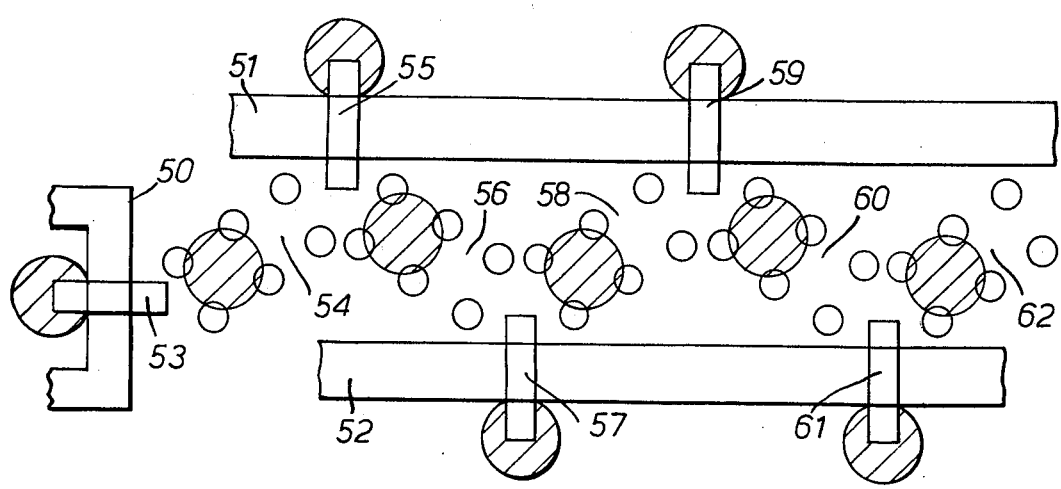
FIG. 6 shows a shifting register using a further type of storage element.

FIG. 6 shows another shifting register in which the storage elements associated with the input and drive conductors comprise simple rectangular bars as in FIG. 5, but the other storage elements are in the form of rectangular arrays, each of six dots of high permeability magnetic material. An array of dots has two parallel rows of three dots, so arranged as to produce two adjacent square spaces for retaining a magnetic bubble. In FIG. 6 the input conductor is 50 and the drive conductors are 51 and 52. A rectangular element 53 is coupled to the conductor 50 and rectangular elements 55 and 59, and 57 and 61 are coupled to the conductors 51 and 52 as shown. The remaining storage elements 54, 56, 58, 60 and 62 are each in the form of an array of six dots. The shaded circles represent the magnetic bubbles held by the patterns of high permeability magnetic material to form the storage element, and as shown are all in the 0 state. The operation of FIG. 6 is substantially as described above for FIG. 4, except that in the case of transfer of information from the element 53 to the element 54 there is a direct transfer without the use of a third element driven by a clock pulse.

Advantages of the present invention compared with the previously proposed methods of using magnetic bubbles for data storage are as follows:

1. As the bubbles move only short distances the requirement for the magnetic film to be free of imperfections over large areas is removed; all that is needed is that within each storage element the magnetic material should have no imperfections which upset the movement of a bubble from one end to the other of the element.
2. There is no need for a controllable bubble generator since the number of bubbles in the device remains the same; information is transferred from one storage element to the other by transferring the position of a bubble rather than the bubble itself.
3. The problem of propagation of bubbles around corners no longer exists because each bubble merely moves from one end of a storage element to the other.

From the above description it will be clear that magnetic bubbles on two paths can be caused to interact so providing the possibility of gating and other logical functions. The technique can also be used for the selective transfer of information from one data propagation path to the another.

The physical basis of the present invention is the employment of the repulsive interaction between two or more bubbles. Each bubble is a magnetic dipole having the same magnetic polarity. If two bubbles are situated at a distance $d$ apart between their centres, then the force of repulsion between them is approximately equal to $(A/d^4)$, where $A$ is a constant of a given magnetic film material and bubble diameter. If three bubbles are situated at a distance $d$ apart one from the other at the apices of an equilateral triangle then the force of repulsion between each bubble is $\sqrt{3}\ A/d^4$. As utilised in the embodiments of the invention described above with reference to FIGS. 4 and 5, because the bubbles are constrained to move along the length of respective storage elements, the effective force of repulsion on one bubble from another must be resolved along the length of a storage element, and therefore the presence of a third bubble doubles the force on a bubble instead of simply increasing it by a factor of $\sqrt{3}$.

The optimum distance between the bubble centres when required to interact could be determined empirically and will depend on material of the magnetic film, the size of the bubble and the geometry of the permalloy layer forming the storage elements. It is considered that this distance will lie in the range 2 to 5 bubble diameters. Another form of storage element is known as a Robinson bar and consists of two annuli joined by a short bar length and width equal approximately to the external radius of each annulus.

It may be possible to replace the storage elements 13, 15, 17, 19 and 21 of FIG. 4 by bars of high permeability magnetic material without associated magnetic bubbles, relying solely on the magnetisation of the material to repel the magnetic bubbles in the storage elements of the register.

As mentioned above, a large number of magnetic bubbles can be generated by superimposing on a steady bias magnetic field a smaller field pulsed with microsecond pulses at a repetition rate of about 1XHz. When each storage element contains a bubble, the superfluous bubbles can be removed from the magnetic film by means of a small increase in the bias field which causes those bubbles not under the high permeability patterns to collapse.

We claim:

1. A shifting register having an ordered plurality of binary digital storage elements each formed by an elongate pattern of high permeability magnetic material on a film of magnetic material common to the patterns and having means for providing a magnetic field across which the film is disposed so as to sustain cylindrical magnetic domains within the film, the pattern being such as to retain a cylindrical magnetic domain at one end or the other of the pattern and to permit transfer of the domain between the ends thereof, each pattern retaining a respective domain, the register further including means coupling adjacent storage elements for causing in response to a shifting pulse the domains in the storage elements to be moved to ends thereof corresponding respectively to the ends of the immediately preceding storage elements at which domains were located prior to the shifting pulse.

2. A binary digital storage element including a film of magnetic material, means for providing a magnetic field across which the film is disposed so as to sustain cylindrical magnetic domains in the film, an elongate pattern of high permeability magnetic material adjacent the surface of the film, the pattern retaining a first cylindrical magnetic domain at one end or the other thereof, means for bringing a second magnetic domain adjacent the one end of the pattern, means for selectively bringing a third magnetic domain adjacent the one end of the pattern in dependence upon the digit to be stored, the second and third domains when adjacent the one end of the pattern being such as to displace the first domain from the one end to the other of the pattern by magnetic repulsion, means for bringing a fourth domain adjacent the other end of the pattern and means responsive to the presence of the first and fourth domains adjacent the other end of the pattern to derive an indication of the digit stored, the presence of the fourth domain and the responsive means being such as to cause the first domain to be shifted from the other end to the one end of the pattern.

3. An element according to claim 2 wherein the magnetic field across which the film is disposed has a steady component on which is superimposed a pulsed smaller field of microsecond duration at a repetition frequency of about 1KHz.

4. An element according to claim 2 in which the elongate pattern of high permeability magnetic material consists of two C-shaped members with their openings facing each other and of such a size that a cylindrical magnetic domain tends to be retained within one or other member.

5. An element according to claim 2 in which the elongate pattern of high permeability magnetic material consists of an elongate rectangle.

6. An element according to claim 2 in which the elongate pattern of high permeability magnetic material consists of an array of six spots in two parallel lines of three and defining two adjacent squares of such a size that a cylindrical magnetic domain tends to be retained within one or other square.

7. An element according to claim 2 in which the responsive means includes means coupled to the first-mentioned pattern to produce an electrical signal in response to the movement of a cylindrical domain from a first end to a second end of the pattern.

8. A binary digital storage element including a film of magnetic material, means for providing a magnetic field across which the film is disposed so as to sustain cylindrical magnetic domains in the film, an elongate pattern of high permeability magnetic material adjacent to the surface of the film, the pattern retaining a cylindrical magnetic domain adjacent one end or the other thereof, means responsive to a binary digit to be stored for selectively shifting the cylindrical magnetic domain from adjacent one end of the pattern to adjacent the other end thereof, whereby the location of the cylindrical magnetic domain relative to the pattern represents the digit stored, means responding to the presence of a cylindrical magnetic domain adjacent an end of the pattern to produce an indication of the digit stored, and means for shifting the cylindrical magnetic domain from adjacent the other end of the pattern to adjacent the one end, and in which the means responsive to a digit to be stored includes second and third elongate patterns of high permeability magnetic material adjacent the surface of the film, the second and third patterns each retaining a respective cylindrical magnetic domain adjacent one end or the other thereof, one end of each of the second and third patterns being adjacent the one end of the first-mentioned pattern, means associated with the second elongate pattern and responsive to the digit to be stored to cause a cylindrical magnetic domain to appear adjacent the one end of the second pattern selectively in dependence on the digit and means associated with the third pattern to cause a cylindrical magnetic domain to appear adjacent the one end of the third pattern, the arrangement of the three patterns being such that a cylindrical magnetic domain adjacent the one end of the first-mentioned pattern would be shifted to the other end of the pattern if cylindrical magnetic domains appear adjacent the one ends of the second and third patterns but not otherwise.

9. An element according to claim 8 wherein the means associated with the third pattern is clock pulse means.

10. An element according to claim 8 wherein the means associated with the third pattern is a second source of data whereby the element is caused to act as a two input AND gate.

11. An element according to claim 8 in which the responding means includes first and second further elongate patterns of high permeability magnetic material disposed relative to the other end of the first-mentioned pattern and retaining respective cylindrical magnetic domains at an end thereof, clock pulse means associated with the first further pattern for causing a cylindrical magnetic domain to appear at one end of the first further pattern nearer the other end of the first-mentioned pattern, the disposition of the first and second elongate patterns relative to the other end of the first-mentioned pattern being such that the simultaneous presence of a cylindrical domain at the other end of the first-mentioned pattern and at the one end of the first further pattern would cause a cylindrical domain in the second further pattern to move from the end of that pattern nearer the other end of the first-mentioned pattern to its other end.

12. A shifting register having first and second conductors respectively for first and second clock pulses, an input conductor for binary digital data, and a plurality of binary digital storage elements each formed by an elongate pattern of high permeability magnetic material on a film of magnetic material and having means for providing a magnetic field across which the film is disposed so as to sustain cylindrical magnetic domains within the film, each pattern retaining a respective cylindrical magnetic domain adjacent one end or the other of the particular pattern, first and second groups of the storage elements being coupled to the first and second conductors respectively so that the locations of the respective magnetic domains are determined by currents in the conductors, and a third group of the storage elements being for storing binary digits on a two elements per bit basis for propagation through the register by the first and second clock pulses, data transfer from one element to the next of the third group being achievable under the control of a particular first or a second clock pulse by virtue of a particular storage element of the corresponding one of the first and second groups and coupled to respond to the particular clock pulse, respective ends of the one and the next elements of the third group and the particular storage element of the first and second groups being so closely disposed adjacent one another with the elongate patterns forming the storage elements extending radially away from the adjacent ends that when cylindrical magnetic domains are located at the three adjacent ends, at least two of the domains are moved by mutual repulsion to the other ends of the respective storage elements, but if only two domains are present at the three adjacent ends then neither is so moved, the input conductor being coupled to a first of the storage elements to determine the end thereof at which the magnetic domain is located.

* * * * *